United States Patent
Cheng et al.

[11] Patent Number: 6,143,670
[45] Date of Patent: Nov. 7, 2000

[54] METHOD TO IMPROVE ADHESION BETWEEN LOW DIELECTRIC CONSTANT LAYER AND SILICON CONTAINING DIELECTRIC LAYER

[75] Inventors: Yao-Yi Cheng, Taipei; Syun-Ming Jang, Hsin-Chu; Chia-Shiung Tsai, Hsin-Chu; Chung-Shi Liu, Hsin-Chu, all of Taiwan

[73] Assignee: Taiwan Semiconductor Manufacturing Company, Hsin-Chu, Taiwan

[21] Appl. No.: 09/222,277

[22] Filed: Dec. 28, 1998

[51] Int. Cl.[7] .................................................. H01L 21/31
[52] U.S. Cl. ........................................... 438/780; 438/623
[58] Field of Search .................................... 438/723, 724, 438/780, 623, 626, 631

[56] References Cited

U.S. PATENT DOCUMENTS

| | | | |
|---|---|---|---|
| 5,472,825 | 12/1995 | Sayka | 430/311 |
| 5,536,681 | 7/1996 | Jang et al. | 437/195 |
| 5,614,270 | 3/1997 | Yeh et al. | 427/539 |
| 5,726,090 | 3/1998 | Jang et al. | 438/435 |
| 5,795,833 | 8/1998 | Yu et al. | 438/780 |
| 5,811,345 | 9/1998 | Yu et al. | 438/735 |
| 5,817,572 | 10/1998 | Chiang et al. | 438/624 |
| 5,858,838 | 1/1999 | Wang et al. | 438/630 |
| 5,880,018 | 3/1999 | Boeck et al. | 438/623 |
| 5,888,309 | 3/1999 | Yu | 438/723 |
| 5,904,566 | 5/1999 | Tao et al. | 438/689 |

*Primary Examiner*—Kevin M. Picardat
*Attorney, Agent, or Firm*—George O. Saile; Stephen B. Ackerman; Stephen G. Stanton

[57] ABSTRACT

A method for forming upon a substrate employed within a microelectronics fabrication a composite dielectric layer with enhanced adhesion. There is first provided a substrate. There is then formed over and upon the substrate a first dielectric layer comprising a silicon, oxygen and nitrogen containing dielectric material in contact with a second dielectric layer comprising an organic polymer spin-on-polymer (SOP) dielectric material. The interface between the dielectric layers may be treated by ion implantation methods to provide the resulting silicon, oxygen and nitrogen containing dielectric layer composition to provide the composite dielectric layer with enhanced adhesion at the interface.

41 Claims, 2 Drawing Sheets

METHOD TO IMPROVE ADHESION BETWEEN LOW DIELECTRIC CONSTANT LAYER AND SILICON CONTAINING DIELECTRIC LAYER

CROSS-REFERENCE TO RELATED APPLICATION

This application is related to co-assigned and co-pending application Ser. No. 09/285,915, filed Apr. 2, 1999, titled "DELAMINATION RESISTANT MULTI-LAYER COMPOSITE DIELECTRIC LAYER EMPLOYING LOW DIELECTRIC CONSTANT DIELECTRIC MATERIAL".

BACKGROUND OF THE INVENTION

1. Field of the Invention

The invention relates generally to the field of low dielectric constant dielectric layers. More particularly, the invention relates to the utilization of low dielectric constant dielectric layers within composite dielectric layers employed within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and patterned microelectronics conductor layer linewidth dimensions have decreased, it has become more common within the art of microelectronics fabrication to employ low dielectric constant dielectric layers formed interposed between the patterns of patterned microelectronics conductor layers within microelectronics fabrications. Low dielectric constant dielectric layers are desirable interposed between the patterns of patterned microelectronics conductor layers within microelectronics fabrications since such low dielectric constant dielectric layers typically provide microelectronics fabrications with enhanced microelectronics fabrication speed, reduced microelectronics fabrication parasitic capacitance and attenuated patterned microelectronics conductor layer cross-talk.

Of the methods and materials which may be employed for forming low dielectric constant dielectric layers interposed between the patterns of patterned microelectronics conductor layers within microelectronics fabrications, methods which employ low dielectric constant dielectric materials such as but not limited to organic polymer spin-on-polymer (SOP) dielectric materials (including but not limited to polyimide organic polymer spin-on-polymer (SOP) dielectric materials, poly (arylene ether) organic polymer spin-on-polymer (SOP) dielectric materials and fluorinated poly (arylene ether) organic polymer spin-on-polymer (SOP) dielectric materials), amorphous carbon dielectric materials (including fluorinated amorphous carbon dielectric materials) and silsesquioxane spin-on-glass (SOG) dielectric materials (including but not limited to hydrogen silsesquioxane (HSQ), carbon bonded hydrocarbon silsesquioxane and carbon bonded fluorocarbon silsesquioxane (FSQ) dielectric materials) are particularly desirable within the art of microelectronics fabrication. Such methods and materials are desirable due in particular to the ease of fabrication of dielectric layers by spin-on methods or by chemical vapor deposition (CVD) methods, and the resulting low dielectric constant of the dielectric layers, which typically exhibit homogeneous dielectric constant values ranging from about 2.5 to about 3.3. For comparison purposes, conventional silicon containing dielectric layers formed of silicon containing dielectric materials such as but not limited to silicon oxide dielectric materials and silicon nitride dielectric materials employed within microelectronics fabrications typically exhibit homogeneous dielectric constants within a range of from about 4.0 to about 4.4.

While low dielectric constant dielectric layers have found increasing applications within microelectronics fabrications, their employment in microelectronics fabrications is not without problems. In particular, there is often observed delamination of a silicon containing dielectric cap layer from a low dielectric constant dielectric layer. In addition, there is frequently a need for a barrier layer impervious to moisture to protect a low dielectric constant dielectric layer from degradation.

Various methods have been disclosed within the art of microelectronics fabrications for forming composite dielectric layers with desirable properties within microelectronics fabrications The provision of adequate adhesion between the component layers of a composite dielectric layer structure is a primary object of the art, as is the capability of filling gaps and other non-planar features of the underlying surfaces of substrates employed in microelectronics fabrications. These objects are achieved by methods which are conventional in the art such as spin-on methods, chemical vapor deposition (CVD) methods and plasma assisted chemical vapor deposition (PECVD} methods. In particular, the enhancement of adhesion of silicon oxide layers to spin-on-polymer (SOP) dielectric layers has been the object of improvement in the art of microelectronics fabrication.

For example, Sayka, in U.S. Pat. No. 5,472,825, discloses a method for forming with attenuated interfacial void a composite dielectric layer comprising a plasma enhanced chemical vapor deposited (PECVD) silicon oxide layer upon which is formed a spin-on-glass (SOG) dielectric layer. The method employs plasma etchback of siliconoxide layer formed employing plasma enhanced chemical vapor deposition (PECVD) method prior to forming the spin-on-glass (SOG) dielectric layer thereon.

Further, Jang, in U.S. Pat. No. 5,536,681, discloses a method for forming a composite dielectric layer comprising a silicon oxide layer formed employing plasma enhanced chemical vapor deposition (PECVD) method as a topographic underlayer upon which is formed a silicon oxide dielectric overlayer formed employing an ozone assisted thermal chemical vapor deposition (CVD) method employing tetra-ethyl-ortho-silicate (TEOS) as a silicon source material. The method employs a selective nitrogen plasma treatment of upperlying portions of the silicon oxide dielectric topographic underlayer such that the silicon oxide overlayer is formed with attenuated voids in the silicon oxide overlayer.

Still further, Yeh, in U.S. Pat. No. 5,614,279, discloses a method for forming a single liquid phase deposited (LPD) layer of silicon oxide with improved physical and electrical properties. The method employs an oxygen or hydrogen plasma treatment of the single liquid phase deposited (LPD) silicon oxide layer once formed.

Finally, Jang et al., in U.S. Pat. No. 5,726,090, disclose a method for forming a composite dielectric layer from: (1) a silicon oxide layer formed employing an ozone assisted thermal chemical vapor deposition (CVD) method employing tetra-ethyl-ortho-silicate (TEOS) as a silicon source material upon: (2) a silicon oxide trench fill layer formed employing thermal oxidation, with attenuated voids within the silicon oxide layer formed by the thermal chemical vapor deposition (CVD) method. The method employs forming a nitrogen plasma treated silicon oxide layer formed by plasma enhanced chemical vapor deposition (PECVD) interposed between the ozone assisted chemical vapor deposited (CVD) silicon oxide overlayer and the silicon oxide underlayer formed by thermal oxidation.

It is therefore towards the goal of forming within microelectronics fabrications low dielectric constant dielectric layers with enhanced adhesion to overlying silicon containing dielectric layers that the present invention is more generally directed.

Desirable in the art of microelectronics fabrication are additional methods and materials which may be employed for forming a composite dielectric layer comprising a low dielectric constant dielectric layer with enhanced adhesion formed employing an organic polymer spin-on-polymer (SOP) dielectric material within a microelectronics fabrication.

SUMMARY OF ThE INVENTION

A first object of the present invention is to provide a method for forming within a microelectronics fabrication a composite dielectric layer comprising a low dielectric constant dielectric layer contacting a silicon containing dielectric layer with enhanced adhesion.

A second object of the present invention is to provide a method in accord with the first object of the present invention, where there is employed an organic polymer spin-on-polymer (SOP) low dielectric constant dielectric material to form the low dielectric constant dielectric layer.

A third object of the present invention is to provide a method in accord with the first object of the present invention and the second object of the present invention, where the method is readily commercially implemented.

In accord with the objects of the present invention, there is provided by the present invention a method for forming within a microelectronics fabrication a composite dielectric layer comprising a low dielectric constant dielectric layer contacting a silicon containing dielectric layer, with enhanced adhesion. To practice the method of the invention, there is first provided a substrate layer. There is then formed over the substrate layer a composite dielectric layer comprising a dielectric layer composed of silicon, oxygen, and nitrogen and a low dielectric constant dielectric layer formed from an organic polymer spin-on-polymer (SOP) dielectric material, with enhanced adhesion. The dielectric layer composed of silicon, oxygen and nitrogen may be formed initially as such, or the composition may be arrived at after initial formation by addition of one or more components. The dielectric layer composed of silicon, oxygen and nitrogen may be formed prior to or subsequent to the formation of the low dielectric constant dielectric layer.

The present invention provides a method for forming a composite dielectric layer employing a low dielectric constant dielectric layer and an overlying or underlying dielectric layer composed of silicon, oxygen and nitrogen with enhanced adhesion with respect to the adhesion obtained with dielectric layers composed only of silicon and oxygen or only of silicon and nitrogen.

The method of the present invention is readily commercially implemented. The method of the present invention employs materials and methods as are generally known in the art of microelectronics fabrication. Since it is a novel ordering of methods, materials and compositions which provides at least in part the present invention, rather than the existence of methods and materials and compositions which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein:

FIG. 4 to FIG. 7 show a series of schematic cross-sectional diagrams illustrating the results of forming upon a substrate within a microelectronics fabrication a composite dielectric layer employing a silicon oxide dielectric underlayer upon which is then formed a low dielectric constant dielectric layer from an organic polymer spin-on-polymer (SOP) low dielectric constant material. An optional upper silicon oxide dielectric layer may also be formed over the low dielectric constant dielectric layer. An ion implantation of nitrogen is employed to add nitrogen to the silicon oxide underlayer to form a dielectric layer comprised of silicon, oxygen and nitrogen, which is formed with enhanced adhesion to the low dielectric constant dielectric layer.

DESCRIPTION OF THE PREFERRED EMBODIMENTS

The present invention provides a method for forming a composite dielectric layer comprising a silicon containing dielectric layer comprising a low dielectric constant dielectric layer, with enhanced adhesion, within a microelectronics fabrication. The method achieves the objects by forming within the composite dielectric layer employing the low dielectric constant dielectric layer a silicon containing dielectric layer comprising silicon, oxygen and nitrogen in contact with the low dielectric constant dielectric layer. More preferably, the silicon containing dielectric layer consists essentially of silicon, oxygen and nitrogen to form silicon oxynitride (SiON).

FIRST PREFERRED EMBODIMENT

Figure 1:
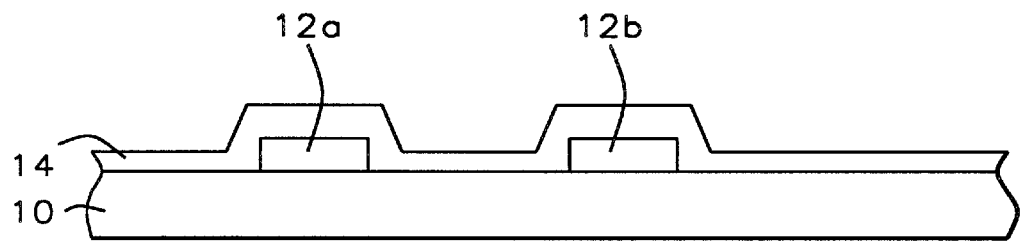
FIG. 1, FIG. 2 and FIG. 3 show a series of schematic cross-sectional drawings illustrating the results of forming over a substrate employed within a microelectronics fabrication a composite dielectric layer comprising an overlying or underlying dielectric layer composed of silicon, oxygen and nitrogen in contact with a low dielectric constant dielectric layer formed employing an organic polymer spin-on-polymer (SOP) low dielectric constant material.
Figure 2:
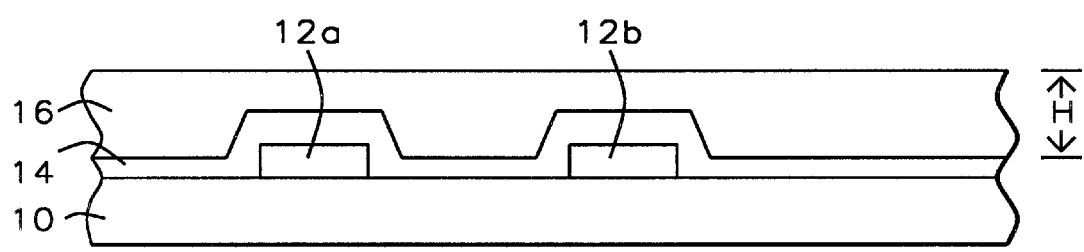
Figure 3:
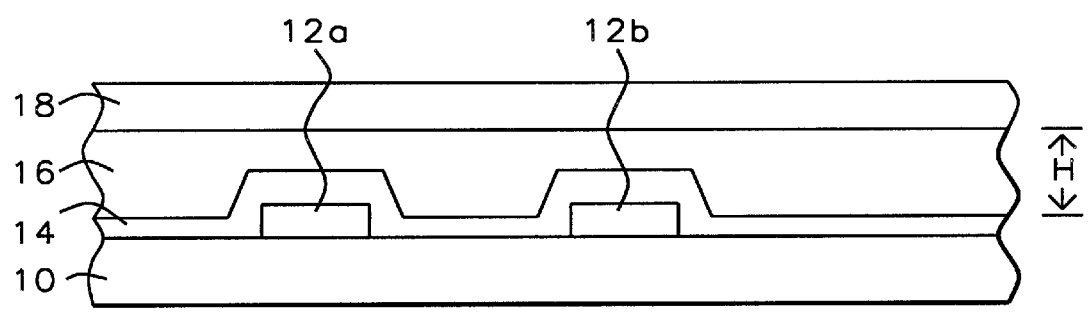

Referring now to FIG. 1 to FIG. 3, there is shown a series of schematic cross-sectional diagrams illustrating the results of forming over a substrate within a microelectronics fabrication in accord with a general embodiment of the present invention which constitutes a first preferred embodiment of the present invention a composite dielectric layer comprising a low dielectric constant dielectric layer formed from an organic polymer spin-on-polymer (SOP) dielectric material with enhanced adhesion in contact with a silicon, oxygen and nitrogen containing dielectric layer. Shown in FIG. 1 is a schematic cross-sectional diagram of the microelectronics fabrication at an early stage in its fabrication.

Shown in FIG. 1 is a substrate 10 employed within a microelectronics fabrication, where the substrate 10 has formed thereupon a pair of patterned microelectronics layers 12a and 12b. Formed over and around the series of patterned microelectronics layers 12a and 12b is a blanket first dielectric layer 14.

Within the first preferred embodiment of the present invention, the substrate 10 may be a substrate employed within a microelectronics fabrication selected from the group including but not limited to integrated circuit microelectronics fabrications, charge coupled device microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication.

In the alternative, the substrate 10 may be the substrate employed within the microelectronics fabrication, where the substrate has any of several additional microelectronics layers such as patterned microelectronics layers 12a and 12b formed thereupon or thereover. Preferably, the patterned microelectronics layers 12a and 12b are formed to a thickness of from about 4000 to about 8000 angstroms. Such additional microelectronics layers (similarly with the substrate 10 itself) may include, but are not limited to microelectronics conductor substrate layers, microelectronics semiconductor substrate layers and microelectronics dielectric substrate layers. Patterned microelectronics layers may be formed by conventional methods as are known in the art of microelectronics fabrication.

With respect to the blanket first dielectric layer 14, the blanket first dielectric layer 14 is formed from a silicon, oxygen and nitrogen containing dielectric material. Methods for forming dielectric layers formed from silicon, oxygen and nitrogen containing dielectric materials include but are not limited to chemical vapor deposition (CVD) methods, plasma enhanced chemical vapor deposition (PECVD) methods, physical vapor deposition (PVD) sputtering methods, reactive sputtering methods, nitrogen plasma treatment methods and nitrogen ion implantation methods. Preferably, the blanket first dielectric layer 14 formed from silicon, oxygen and nitrogen containing dielectric material is formed by plasma enhanced chemical vapor deposition (PECVD) of silicon oxynitride (SiON). Preferably, the blanket first dielectric layer 14 comprising silicon, oxygen and nitrogen is formed to a thickness of from about 300 to about 2000 angstroms.

Referring now to FIG. 2, there is shown a schematic cross-sectional diagram illustrating the results of further processing of the microelectronics fabrication whose schematic cross-sectional diagram is shown in FIG. 1. Shown in FIG. 2 is s schematic cross-sectional diagram of a microelectronics fabrication otherwise equivalent to the microelectronics fabrication shown in FIG. 1, but wherein a blanket second low dielectric constant dielectric layer 16 has been formed upon the blanket first dielectric layer 14. The blanket second low dielectric constant dielectric layer 16 is formed employing an organic polymer low dielectric constant spin-on-polymer (SOP) dielectric material.

With respect to the low dielectric constant dielectric layer 16, the low dielectric constant dielectric layer 16 is formed employing any one of several organic polymer spin-on-polymer (SOP) dielectric materials known in the art of microelectronics fabrication, including but not limited to polyimide organic polymer spin-on-polymer (SOP) dielectric material, poly (arylene ether) spin-on-polymer (SOP) dielectric material and fluorinated poly(arylene ether) spin-on-polymer(SOP) dielectric material. Preferably, the low dielectric constant organic polymer spin-on-polymer (SOP) dielectric material employed to form the blanket second low dielectric constant dielectric layer 16 is a fluorinated poly (arylene ether) commercially available as PAE 2.0 spin-on-polymer (SOP) dielectric material available from Schumacher Corporation, Carlsbad, CA., USA. Equally preferably, the low dielectric constant spin-on-polymer (SOP) dielectric material is a fluorinated poly (arylene ether) commercially available as Flare 2.0 from Allied Signal Co. CA., U.S.A. As illustrated within the schematic cross-sectional diagram of FIG. 2, the blanket second low dielectric constant dielectric layer 16 may be formed to a thickness H of from about 3000 to about 20,000 angstroms.

Referring now to FIG. 3, there is shown a schematic cross-sectional diagram illustrating the results of further processing of the microelectronics fabrication whose schematic cross-sectional diagram is shown in FIG. 2. Shown in FIG. 3 is a schematic cross-sectional diagram of a microelectronics fabrication otherwise equivalent to the microelectronics fabrication shown in FIG. 2, but wherein a blanket third dielectric layer 18 comprising silicon, oxygen and nitrogen is formed with enhanced adhesion over and upon the blanket second low dielectric constant dielectric layer 16.

With respect to the blanket third dielectric layer 18 formed over and upon the blanket second low dielectric constant dielectric layer 16, the blanket third dielectric layer 18 comprised of silicon, oxygen and nitrogen is formed employing materials and methods analogous or equivalent to those employed to form the blanket first dielectric layer 14. Since preferably the dielectric layer is formed by plasma enhanced chemical vapor deposition (PECVD) of a dielectric material comprised of silicon, oxygen and nitrogen, the exposure of the surface of the blanket second low dielectric constant dielectric layer 16 formed from the organic polymer spin-on-polymer (SOP) dielectric material to plasma nitrogen containing plasma species is beneficial in enhancing adhesion of the dielectric layer. The adhesion of the blanket third dielectric layer 18 comprised of silicon, oxygen and nitrogen to the blanket second low dielectric constant dielectric layer 16 is enhanced over the adhesion found for dielectric layers comprised of silicon and oxygen alone or of silicon and nitrogen alone in comparable composite dielectric layers.

With respect to the blanket third dielectric layer 18 formed from silicon, oxygen and nitrogen containing dielectric material, an optional treatment not shown in FIG. 3 of the blanket second low dielectric constant dielectric layer 16 to a plasma prior to formation of the blanket third dielectric layer 18 may also be beneficial in enhancing adhesion of the composite dielectric layer. The plasma may be formed by methods using materials as are commonly employed in the art of microelectronics fabrication.

With respect to the composite dielectric layer of the first preferred embodiment of the present invention, the enhanced adhesion is obtained with respect to the blanket second low dielectric constant dielectric layer 16 with at least one of an underlying and an overlying dielectric layer comprised of silicon, oxygen and nitrogen. Additional composite dielectric layers may be formed by the methods and materials of the preferred first embodiment of the present invention either underlying and/or overlying the composite dielectric layer with the same enhancement of adhesion to the low dielectric constant dielectric layer.

SECOND PREFERRED EMBODIMENT

Referring now to FIG. 4 to FIG. 7, there is shown a series of cross-sectional diagrams illustrating the results of forming upon a substrate employed within a microelectronics fabrication in accord with a more specific embodiment of the present invention which comprises a second preferred embodiment of the present invention a composite dielectric layer comprising a low dielectric constant dielectric layer formed employing an organic polymer spin-on-polymer (SOP) dielectric material in contact with one or more silicon containing dielectric layers upon a substrate.

Figure 4:
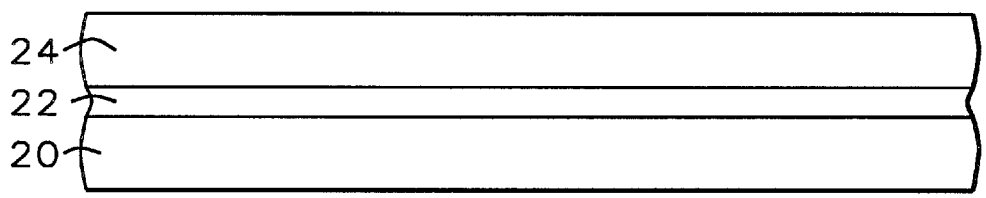
FIG. 4, FIG. 5, FIG. 6 and FIG. 7 are directed towards a more specific embodiment of the present invention.

Shown in FIG. 4 is a substrate 20 having formed upon its surface a silicon oxide dielectric layer 22. Upon the surface of the silicon oxide dielectric layer 22 is a low dielectric constant dielectric layer 24 formed employing an organic polymer spin-on-polymer (SOP) dielectric material. The substrate 20 is analogous or equivalent to the substrate 10 employed within the microelectronics fabrication shown in FIG. 1.

With respect to the silicon oxide dielectric layer 22, the silicon oxide dielectric layer 22 may be formed by methods as are known in the art of microelectronics fabrication, including but not limited to thermal growth methods, chemical vapor deposition (CVD) methods, plasma assisted chemical vapor deposition (PECVD) methods, sub-atmospheric pressure thermal chemical vapor deposition (SACVD) methods, physical vapor deposition (PVD) sputtering methods and reactive sputtering methods. Preferably the silicon oxide dielectric layer 22 is formed employing plasma enhanced chemical vapor deposition (PECVD) methods.

With respect to the low dielectric constant dielectric layer 24, the low dielectric constant dielectric layer 24 is formed employing a spin-on-polymer (SOP) method analogous or equivalent to the spin-on-polymer employed to form the blanket second low dielectric constant dielectric layer 16 shown in FIG. 1 of the first preferred embodiment of the method of the present invention. Preferably, the organic polymer spin-on-polymer (SOP) dielectric material is a fluorinated poly (arylene ether) commercially available as Flare 2.0, from Allied Signal Corporation, CA., U.S.A. Equally preferable is a fluorinated poly (arylene ether) commercially available as PAE 2.0, from Schumacher Corp., Carlsbad, CA., U.S.A. Preferably, the low dielectric constant dielectric layer is formed from a thickness of from about 3000 to about 20,000 angstroms.

Figure 5:
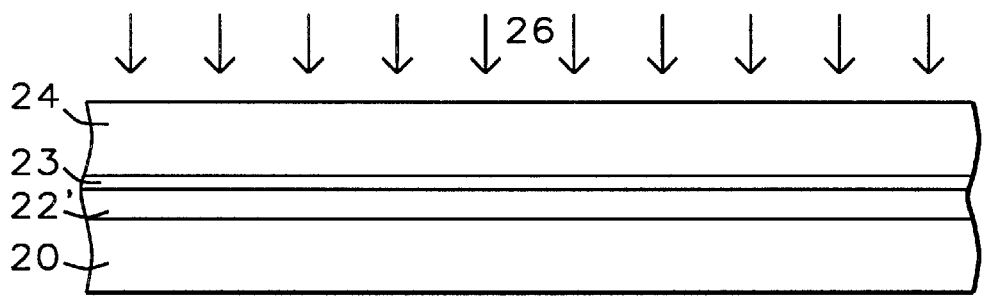

Referring now to FIG. 5, there is shown a schematic cross-sectional diagram illustrating the results of further processing of the microelectronics fabrication whose schematic cross-sectional diagram is shown in FIG. 4. Shown in FIG. 5 is a schematic cross-sectional diagram of a microelectronics fabrication otherwise equivalent to the microelectronics fabrication whose schematic cross-sectional diagram is shown in FIG. 4, but wherein a nitrogen ion implantation 26 has been performed upon the microelectronics substrate employed with in the microelectronics fabrication shown in FIG. 4. The nitrogen ion dose and energy are chosen to form at the interface a thin layer of dielectric material 23 composed of silicon, oxygen and nitrogen along with a depleted silicon oxide layer 22'. The ion implantation 26 may be performed before or after the formation of the low dielectric constant dielectric layer 24.

With respect to the ion implantation of nitrogen ions 26 shown in FIG. 5, the ion implantation methods are employed as is conventional in the art of microelectronics fabrication.

Figure 6:
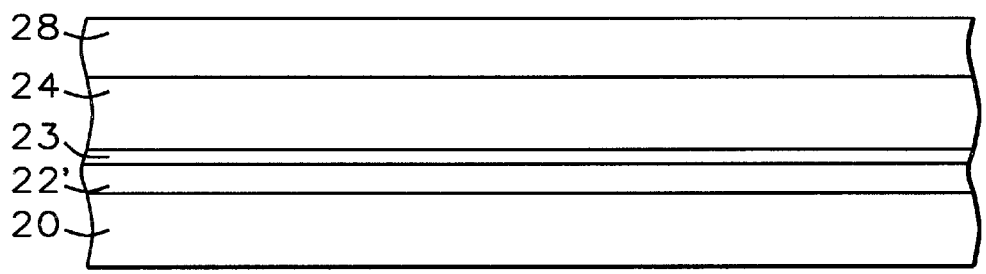

Referring now to FIG. 6, there is shown a schematic cross-sectional diagram illustrating the results of farther processing of the microelectronics fabrication whose schematic cross-sectional diagram is shown in FIG. 5. Shown in FIG. 6 is a schematic cross-sectional diagram of a microelectronics fabrication otherwise equivalent to the mifcroelectronics fabrication whose schematic cross-sectional diagram is shown in FIG. 5, but wherein an additional silicon oxide dielectric layer 28 is shown formed upon the low dielectric constant dielectric layer 24 prior to ion implantation 26 provided that ion implantation 26 is to take place after formation of the low dielectric constant dielectric layer 24.

With respect to the silicon oxide dielectric layer 28, the silicon oxide layer 28 is formed by methods equivalent or analogous to the methods employed to form the silicon oxide dielectric layer 22 shown in FIG. 1 of this second preferred embodiment of the present invention. Preferably, the silicon oxide dielectric layer 28 is formed employing a plasma enhanced chemical vapor deposition (PECVD) method.

Figure 7:
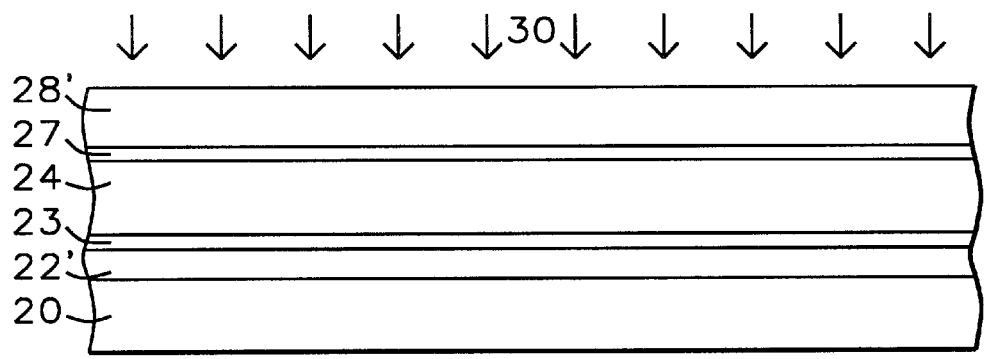

Referring now to FIG. 7, there is shown a schematic cross-sectional diagram of a microelectronics fabrication illustrating the results of further processing of the microelectronics fabrication shown in FIG. 6. Shown in FIG. 7 is a schematic cross-sectional diagram of a microelectronics fabrication otherwise equivalent to the microelectronics fabrication whose schematic cross-sectional diagram is shown in FIG. 6, but wherein there has been treated the microelectronics fabrication to a nitrogen ion implantation 30 analogous or equivalent to the first nitrogen ion implantation 26 shown in FIG. 5. The nitrogen ion implantation 30 thus forms a second interfacial region 27 wherein there is a dielectric layer formed of the depleted silicon oxide dielectric layer 28', now containing silicon, oxygen and nitrogen, analogous to the region 23 of FIG. 5.

With respect to nitrogen ion implantation of the microelectronics fabrication as described in the second preferred embodiment of the present invention, there is no substantial result of the interaction of the nitrogen ion implantation process on any property or subsequent behavior of the low dielectric constant dielectric layer 24. The enhanced adhesion is due to the formation of a silicon, oxygen and nitrogen containing dielectric material at the interface between the low dielectric constant dielectric layer 24 and the silicon containing dielectric layer or layers 22' and 28' in contact with the low dielectric constant dielectric layer 24.

With respect to the composite dielectric layer comprising the low dielectric constant dielectric layer formed employing an organic polymer spin-on-polymer (SOP) dielectric material, an optional treatment with a plasma prior to contact with other dielectric layers such as, for example, silicon oxide layer 28 may also be beneficial to enhance adhesion.

As is understood by a person skilled in the art, the preferred embodiments of the present invention are illustrative of the present invention rather than limiting of the present invention. Revisions and modifications may be made to methods, materials, structures and dimensions through which may be formed microelectronics fabrications and semiconductor integrated circuit microelectronics fabrications having formed therein and within dielectric layers formed in accord with the method of the present invention, as defined by the appended claims.

What is claimed is:

1. A method for forming a composite dielectric layer comprising:

providing a substrate having at least one patterned layer thereover;

forming over the substrate and the patterned layer, a first dielectric layer comprising a silicon, oxygen and nitrogen containing dielectric material forming a second dielectric layer continuously and contiguously over the first dielectric layer, the second dielectric layer comprising an organic polymer spin-on-polymer (SOP) dielectric material; and forming a cap oxynitride layer over the second dielectric layer.

2. The method of claim 1 wherein the substrate is a substrate employed within a microelectronics fabrication chosen from the group consisting of:

integrated circuits microelectronics fabrications;

charge coupled device microelectronics fabrications;

solar cell microelectronics fabrications;

ceramic substrate microelectronics fabrications; and flat panel display microelectronics fabrications.

3. The method of claim 1 wherein the organic polymer spin-on-polymer (SOP) dielectric material is selected from the group consisting of:

polyimide organic polymer spin-on-polymer (SOP) dielectric materials;

poly (arylene ether) organic polymer spin-on-polymer (SOP) dielectric materials; and fluorinated poly(arylene ether) organic polymer spin-on-polymer (SOP) dielectric materials.

4. The method of claim 1 wherein the first dielectric layer is formed as a homogeneous silicon, oxygen and nitrogen containing dielectric layer.

5. The method of claim 4 wherein the homogeneous silicon, oxygen and nitrogen containing dielectric layer is formed employing a chemical vapor deposition (CVD) method.

6. The method of claim 1 wherein the second dielectric layer is formed from an organic polymer spin-on-polymer (SOP) dielectric material treated with a plasma prior to forming the dielectric layer upon the first dielectric layer.

7. The method of claim 1 wherein the first dielectric layer is formed employing a nitrogen ion implantation of a silicon oxide dielectric layer.

8. The method of claim 7 wherein the nitrogen ion implantation is upon the surface of the silicon oxide dielectric layer.

9. The method of claim 7 wherein the nitrogen ion implantation is through the silicon oxide dielectric layer to an interface with the low dielectric constant dielectric layer formed employing the organic polymer spin-on-polymer (SOP) dielectric material.

10. The method of claim 7 wherein the nitrogen ions are implanted through the low dielectric constant dielectric layer formed employing an organic polymer spin-on-polymer (SOP) dielectric material.

11. The method of claim 1, wherein the first dielectric layer is from about 300 to 2000 Å thick, and the second dielectric layer is from about 3000 to 20,000 Å thick.

12. A method of forming a composite dielectric layer, comprising the steps:

providing a substrate;

forming a SiON dielectric material layer over the substrate;

forming an organic polymer SOP dielectric material layer continuously and contiguously over the SiON layer; and forming a SiON dielectric material cap layer over the SOP layer.

13. The method of claim 12, wherein the SiON dielectric material layer is from about 300 to 2000 Å thick, and the SOP layer is from about 3000 to 20,000 Å thick.

14. The method of claim 12, wherein the substrate is a substrate employed within a microelectronics fabrication chosen from the group consisting of:

integrated circuits microelectronics fabrications;

charge coupled device microelectronics fabrications;

solar cell microelectronics fabrications;

ceramic substrate microelectronics fabrications; and flat panel display microelectronics fabrications.

15. The method of claim 12 wherein the organic polymer SOP dielectric material is selected from the group consisting of:

polyimide organic polymer SOP dielectric materials;

poly (arylene ether) organic polymer SOP dielectric materials; and fluorinated poly(arylene ether) organic polymer SOP dielectric materials.

16. The method of claim 12 wherein the SiON dielectric material layer is formed as a homogeneous silicon, oxygen and nitrogen containing dielectric layer.

17. The method of claim 16 wherein the homogeneous silicon, oxygen and nitrogen containing dielectric layer is formed employing a chemical vapor deposition (CVD) method.

18. The method of claim 12 wherein the SiON dielectric material layer is formed from an organic polymer spin-on-polymer (SOP) dielectric material treated with a plasma prior to forming the SiON dielectric material layer upon the organic polymer SOP dielectric material layer.

19. The method of claim 12 wherein the SiON dielectric material layer is formed employing a nitrogen ion implantation of a silicon oxide dielectric layer.

20. The method of claim 19 wherein the nitrogen ion implantation is upon the surface of the silicon oxide dielectric layer.

21. The method of claim 19 wherein the nitrogen ion implantation is through the organic polymer SOP dielectric material layer to an interface with the SiON dielectric material layer.

22. The method of claim 19 wherein the nitrogen ions are implanted through the organic polymer SOP dielectric material.

23. A method of forming a composite dielectric layer, comprising the steps:

providing a substrate;

forming a silicon oxide layer over the substrate;

forming an organic polymer SOP dielectric material layer continuously and contiguously over the silicon oxide layer;

performing a nitrogen implant through the organic polymer SOP dielectric material layer and into the silicon oxide layer to form a SiON dielectric material layer from a portion of the silicon oxide layer, the SiON dielectric material layer being adjacent the organic polymer SOP dielectric material layer;

forming a SiON dielectric material cap layer over the SOP layer.

24. The method of claim 23, wherein the SiON dielectric material layer is from about 300 to 2000 Å thick, and the SOP layer is from about 3000 to 20,000 Å thick.

25. The method of claim 23, wherein the substrate is a substrate employed within a microelectronics fabrication chosen from the group consisting of:

integrated circuits microelectronics fabrications;

charge coupled device microelectronics fabrications;

solar cell microelectronics fabrications;

ceramic substrate microelectronics fabrications; and flat panel display microelectronics fabrications.

26. The method of claim 23 wherein the organic polymer SOP dielectric material is selected from the group consisting of:

polyamide organic polymer SOP dielectric materials;

poly (arylene ether) organic polymer SOP dielectric materials; and fluorinated poly(arylene ether) organic polymer SOP dielectric materials.

27. The method of claim 23 wherein the SiON dielectric material layer is formed as a homogeneous silicon, oxygen and nitrogen containing dielectric layer.

28. The method of claim 27 wherein the homogeneous silicon, oxygen and nitrogen containing dielectric layer is formed employing a chemical vapor deposition (CVD) method.

29. The method of claim 23 wherein the SiON dielectric material layer is formed from an organic polymer spin-on-polymer (SOP) dielectric material treated with a plasma prior to forming the SiON dielectric material layer upon the organic polymer SOP dielectric material layer.

30. The method of claim 23 wherein the SiON dielectric material layer is formed employing a nitrogen ion implantation of a silicon oxide dielectric layer.

31. The method of claim 30 wherein the nitrogen ion implantation is upon the surface of the silicon oxide dielectric layer.

32. The method of claim 30 wherein the nitrogen ion implantation is through the organic polymer SOP dielectric material layer to an interface with the SiON dielectric material layer.

33. A method of forming a composite dielectric layer, comprising the steps:

providing a substrate;

forming a SiON dielectric material layer over the substrate;

forming an organic polymer SOP dielectric material layer continuously and contiguously over the SiON dielectric material layer;

forming a silicon oxide layer over the organic polymer SOP dielectric material layer; and performing a nitrogen implant into a portion of the silicon oxide layer adjacent the organic polymer SOP dielectric material layer to form a SiON dielectric material cap layer from the portion of the silicon oxide layer adjacent the organic polymer SOP dielectric material layer.

34. The method of claim 33, wherein the substrate is a substrate employed within a microelectronics fabrication chosen from the group consisting of:

integrated circuits microelectronics fabrications;

charge coupled device microelectronics fabrications;

solar cell microelectronics fabrications;

ceramic substrate microelectronics fabrications; and flat panel display microelectronics fabrications.

35. The method of claim 33 wherein the organic polymer SOP dielectric material is selected from the group consisting of:

polyimide organic polymer SOP dielectric materials;

poly (arylene ether) organic polymer SOP dielectric materials; and fluorinated poly(arylene ether) organic polymer SOP dielectric materials.

36. The method of claim 33, wherein the SiON dielectric material layer is formed as a homogeneous silicon, oxygen and nitrogen containing dielectric layer.

37. The method of claim 36 wherein the homogeneous silicon, oxygen and nitrogen containing dielectric layer is formed employing a chemical vapor deposition (CVD) method.

38. The method of claim 33 wherein the SiON dielectric material layer is formed from an organic polymer spin-on-polymer (SOP) dielectric material treated with a plasma prior to forming the SiON dielectric material layer upon the organic polymer SOP dielectric material layer.

39. The method of claim 33 wherein the SiON dielectric material layer is formed employing a nitrogen ion implantation of a silicon oxide dielectric layer.

40. The method of claim 39 wherein the nitrogen ion implantation is through the organic polymer SOP dielectric material layer to an interface with the SiON dielectric material layer.

41. The method of claim 39 wherein the nitrogen ions are implanted through the organic polymer SOP dielectric material.

* * * * *